United States Patent [19]

Minezaki

[11] Patent Number: 4,514,253
[45] Date of Patent: Apr. 30, 1985

[54] MANUFACTURE OF THIN FILM TRANSISTOR

[75] Inventor: Shigehiro Minezaki, Ikoma, Japan

[73] Assignee: Sharp Kabushiki Kaisha, Osaka, Japan

[21] Appl. No.: 517,042

[22] Filed: Jul. 25, 1983

Related U.S. Application Data

[62] Division of Ser. No. 288,330, Jul. 30, 1981, abandoned.

[30] Foreign Application Priority Data

Jul. 31, 1980 [JP] Japan .................. 55-106887

[51] Int. Cl.³ .............. H01L 21/312; C23F 1/02; B44C 1/22; C03C 15/00
[52] U.S. Cl. .................. 156/659.1; 29/591; 156/656; 204/42; 204/38.3; 427/88; 357/4; 357/11; 430/313; 430/318

[58] Field of Search ............ 357/4, 11, 15, 16, 23, 357/41; 427/84, 86, 82, 88–91; 29/571, 580, 591; 430/313, 314, 316, 317, 318; 204/192 EC, 192 E, 38 A, 42; 156/643, 646, 649, 653, 656, 657, 659.1, 661.1, 662

[56] References Cited

U.S. PATENT DOCUMENTS 4,065,781  12/1977  Gutknecht .................. 357/23

Primary Examiner—William A. Powell
Attorney, Agent, or Firm—Birch, Stewart, Kolasch & Birch

[57] ABSTRACT

A thin film transistor is disclosed which has an insulator substrate, a gate electrode, a semiconductor layer and a source/drain electrode disposed on the insulator substrate. The source/drain electrode is patterned through a combination of mask deposition technique and photolithography technique.

14 Claims, 87 Drawing Figures

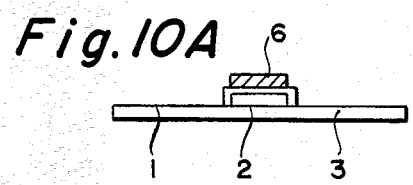
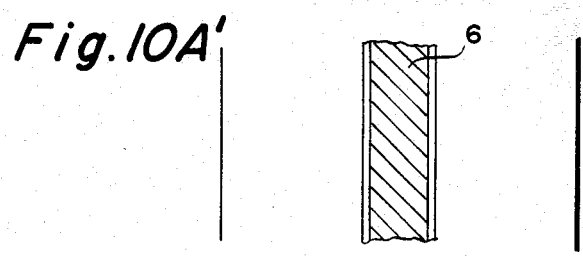
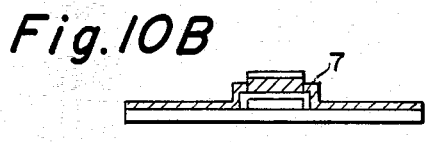
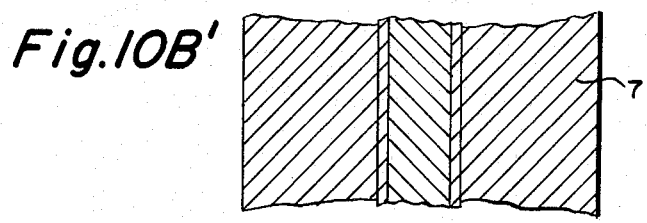
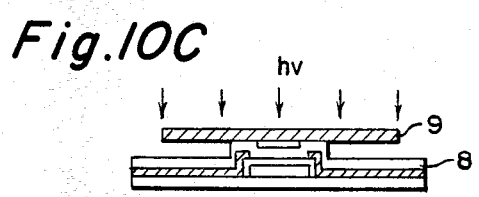
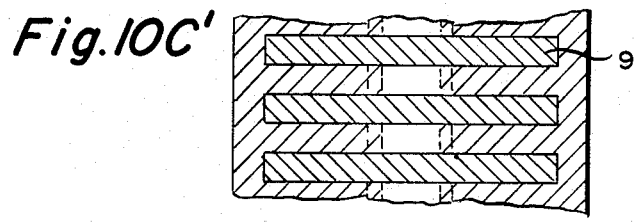
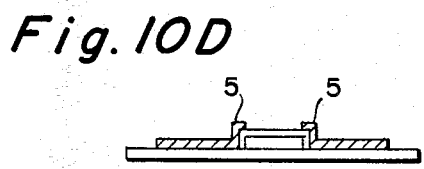
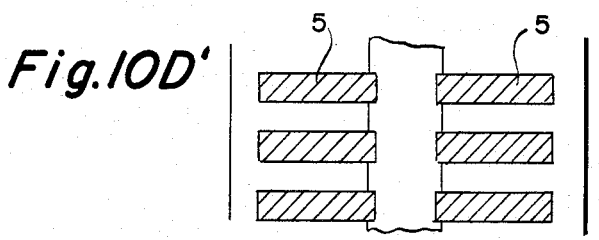
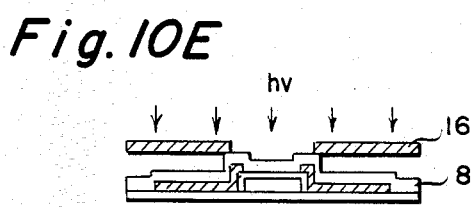
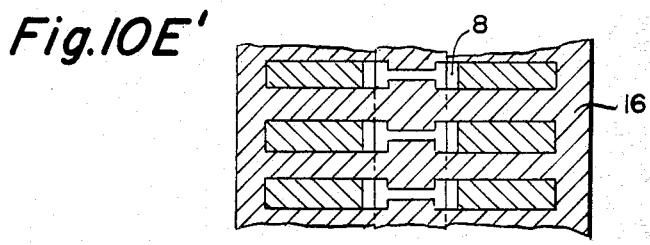
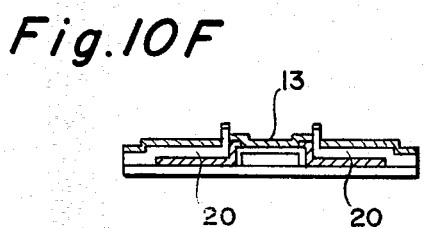
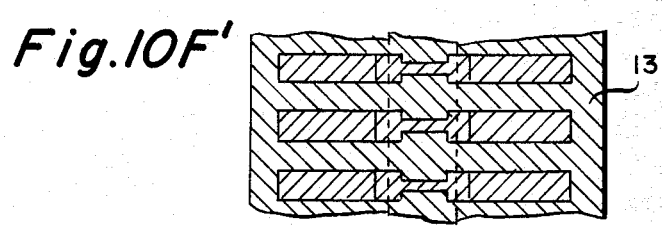
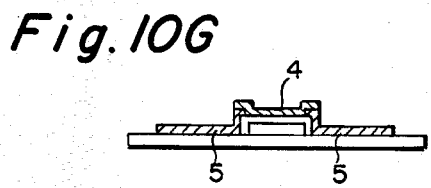
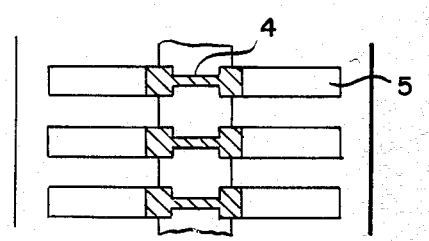

MANUFACTURE OF THIN FILM TRANSISTOR

BACKGROUND OF THE INVENTION

This application is a divisional of application Ser. No. 288,330, filed on July 30, 1981, abandoned.

This invention relates to a thin film transistor device (hereinafter referred to as "TFT") and a method for making the same.

Some examples of the developments of TFT devices are illustrated in FIGS. 1, 2 and 3. FIG. 1 shows the staggered type of TFT device and FIG. 2 shows the coplanar type of TFT device. The manufacture of these TFT devices will be discussed hereinafter by reference to FIGS. 4 and 5.

A cross sectional view of the structure of the staggered type TFT device is shown in FIG. 1(A) and a plan view is shown in FIG. 1(B). The sequence of the manufacture of the staggered type TFT device will be described in terms of the flow chart of FIG. 4.

A gate electrode 2 typically Al, Ta, Zr, Hf or Nb is disposed on a glass substrate 1 by mask deposition, lift-off method or dry-etching (4-I). A surface of the gate electrode 2 is oxided to make up a gate insulating coating 3 through anode oxidation. An alternative way to form the gate insulating coating 3 is evaporation of an oxide such as $SiO_2$, $Al_2O_3$, $Ta_2O_3$, $Zr_2O_5$ and $Y_2O_3$ (4-II). Subsequently, a semiconductor layer 4 is patterned by a well known method, for example, mask deposition, chemical etching, lift-off method and dry-etching (4-III). Through mask deposition, chemical etching, lift-off method or dry-etching, a source/drain electrode 5 is disposed on the patterned semiconductor layer 4 (4-IV).

The coplanar type TFT device as shown in schematic cross sectional views of FIGS. 2(A) and 3(A) and plan views of FIGS. 2(B) and 3(B) is made in the following manner as best shown a flow chart of FIG. 5. A gate electrode 2 typically of Al, Ta, Zr, Hf or Nb is disposed on a glass substrate 1 by mask deposition, lift-off method or dry-etching (5-I). On a surface of the gate electrode 2 there is disposed a gate insulating coating 3 through anodic oxidation or the use of an oxide such as $SiO_2$, $Al_2O_3$, $Ta_2O_3$ and $Y_2O_3$ (5-II). Subsequently, a source/drain electrode 5 typically of Ni, Au or the like is patterned by a well known method, for example, mask deposition, chemical etching, lift-off method and dry-etching (5-III). In addition, a semiconductor layer 4 is patterned through mask deposition, chemical etching, lift-off method or dry-etching (5-IV).

While the staggered type TFT device and the coplanar type TFT device are made in the above mentioned manner, various problems are experienced as follows in patterning the source/drain electrode and the semiconductor layer.

(1) When it is desired to set up the source/drain electrode in the staggered type TFT device by chemical etching, a metal material such as Ni and Au is evaporated throughout the gate insulating coating 3 and the semiconductor layer 4 and a photo-resist pattern is made for the source/drain electrode 5 by the use of a photo-resist material. Then, the source/drain electrode is patterned through chemical etching. Patterning is performed with an $HNO_3$$_2O$ system etchant in the case of Ni as a material for the source/drain electrode and with an $NH_4I$—$I_2$—$C_2H_5OH$—$H_2O$ system or $HNO_3$—$HCl$ system etchant in the case of Au as a source/drain electrode material. However, these conventional etchants will corrode the underlying semiconductor layer and degrade the characteristics and performances of the TFT device. Especially when the semiconductor is made of Te, the Te layer will sometimes completely disappear and lose its performance. The same problem will come up when the source/drain electrode is built up by the lift-off method. The Suis reaction takes place on the photo-resist coating with the resulting growth of alkali-soluble indene carboxylic acid after exposure in building up a resist pattern for the source/drain electrode 5 of FIG. 1 through the use of a naphthoquinone diazide or benzoquinone photoresist coating. The carboxylic acid is soluble in an inorganic or organic alkali solution, which in turn will corrode the semiconductor electrode Te during lift-off formation of a resist pattern.

(2) For the coplanar type TFT device, it is possible to form the source-drain electrode through a photo-lithography technique such as with the above mentioned chemical etching and lift-off method. However, an edge portion of the source/drain electrode will be undercut and thus susceptible to breaks. These problems are crucial when the semiconductor electrode is made of Te and has a very thin thickness of 100 to 200 Å due to functional requirements.

(3) The patterned semiconductor film and the source/drain electrode may be in principle made up by mask deposition which is free of the above stated problems (1) and (2). In this case, the previously formed semiconductor film and the gate oxide film are easily damaged when an evaporation mask is brought into alignment with the substrate. Such alignment between the evaporation mask and the substrate is difficult and undesirable for mass production for the manufacture of TFT devices which demands very fine patterns.

Any one of the above discussed patterning techniques such as chemical etching, lift-off method and mask deposition suffers from any of the disadvantages described in manufacturing the staggered type TFT device or the coplanar type TFT device.

OBJECTS AND SUMMARY OF THE INVENTION

Accordingly, it is an object of the present invention to provide a TFT structure and a method for making the same which can overcome the above discussed disadvantages.

In accordance with the above objective, the present invention provides a thin film transistor comprising an insulator substrate, a gate electrode, a semiconductor layer and a source/drain electrode disposed on the insulator substrate, wherein the source/drain electrode is patterned through a combination of a mask deposition technique and a photo-lithography technique.

In another aspect of the present invention, there is provided a method for making a thin film transistor comprising an insulator substrate, a gate electrode, a semiconductor layer and a source/drain electrode disposed on the insulator substrate, said method comprising the step of patterning the source/drain electrode through a combination of a mask deposition technique and a photo-lithography technique.

BRIEF DESCRIPTION OF THE DRAWINGS

For a more complete understanding of the present invention and for further objects and advantages therof, reference is now made to the following description taken in conjunction with the accompanying drawings, in which:

FIGS. 7A to 13H' are flow charts for explanation of the manufacture of a TFT device according to preferred embodiments of the present invention.

DETAILED DESCRIPTION OF THE INVENTION

EXAMPLE 1

Figure 7A:
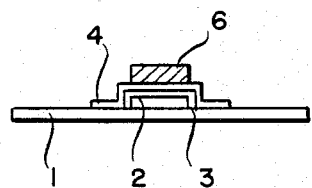
Figure 7A:
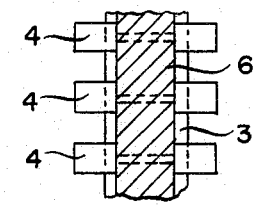

FIGS. 7(A), 7(A)' through 7(F), 7(F)' are views for explaining the steps of making a TFT device according to an embodiment of the present invention. A gate electrode 2 is disposed on a glass substrate 1 and made of Al, Ta, Nb or the like as a proper electrode material. This formation may be achieved by mask deposition, lift-off method or wet-etching. The gate electrode 2 is dipped into an ammonium borate solution, for example, to thereby develop a gate insulating coating 3 through anodic oxidation. As an alternative, this insulating coating may be deposited through the evaporation of $SiO_2$, $Al_2O_3$, $Y_2O_3$ and so forth. Then, a semiconductor layer 4 typically of Te is formed through lift-off technique. A photo-resist coating (e.g., AZ 1350 by Shipley Co.) of a thickness of 0.3 $\mu$m to 0.6 $\mu$m is deposited, pre-baked and selectively exposed to light which is originated from a 500 W high voltage mercury-arc lamp, for example. Development is carried out with a solution which is a dilution of an AZ developer (Shipley Co.) with distilled water. This is followed by rinsing and post-baking. A semiconductor layer of Te is formed and subjected to ultrasonic cleaning in acetone for formation of a desired pattern of the semiconductor layer.

Figure 7B:
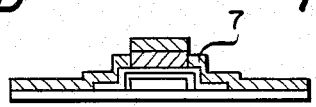
Figure 7B:
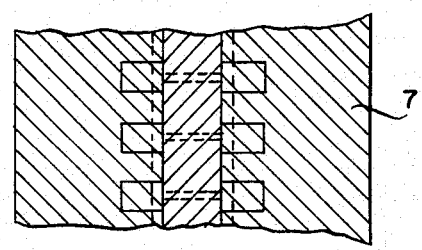
Figure 7C:
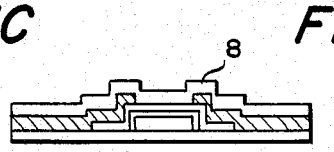
Figure 7C:
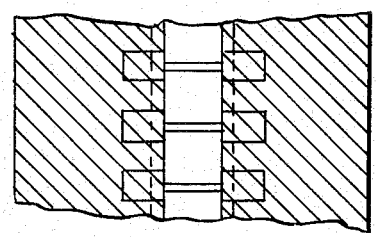

As shown in FIGS. 7(A) and 7(A)', a portion of the gate insulating coating 3 and the Te semiconductor layer 4 is provided with a mask 6 through the use of a wire or a strip of Fe—Ni—Co alloy, tungsten or stainless steel and a material for the source/drain electrode, for example, Au and Ni is deposited as indicated in FIGS. 7(B) and 7(B)'. The mask 6 is removed and a photo-resist coating (e.g., AZ 1350 by Shipley Co.) 8 having a thickness of 0.3–0.6 $\mu$m is disposed on the thus deposited electrode 7 as shown in FIGS. 7(C) and 7(C)'.

Figure 7D:
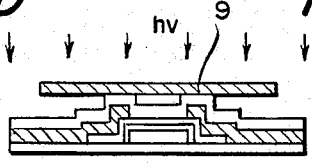
Figure 7D:
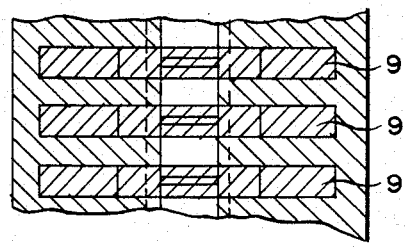
Figure 7E:
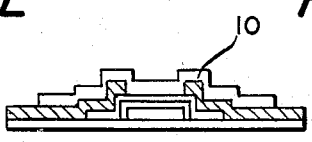
Figure 7E:
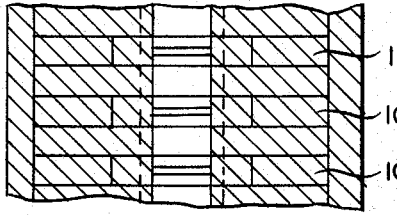
Figure 7F:
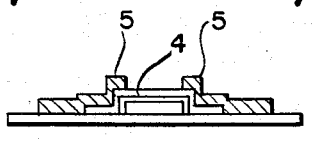
Figure 7F:
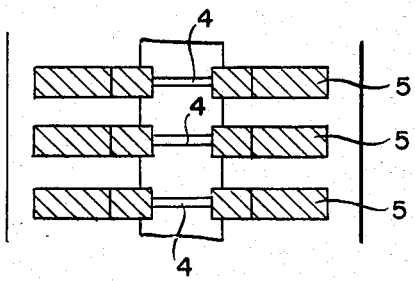

After pre-baking, the semiconductor layer is covered with a mask 9, as shown in FIGS. 7(D) and 7(D)', and exposed selectively to light through the use of a 500 W mercury-arc lamp. Development is conducted with an AZ developer diluted with distilled water to form a desired resist pattern 10 as shown in FIGS. 7(E) and 7(E)'. In the case that the metallic coating for the source/drain electrode is Ni, it is etched with an $HNO_3$—$H_2O$ solution for the buildup of a source/drain electrode pattern 5 as shown in FIGS. 7(F) and 7(F)'. In the case of a Au coating, etching takes place in an $I_2$—$NH_4$—$H_2O$—$C_2H_5OH$ solution, thus making a desired pattern 5 for the source/drain electrode.

Since in the above illustrated embodiment the semiconductor layer Te is covered or protected by the resist coating as seen from FIGS. 7(E) and 7(E)', a TFT device can be made without the influence or effect of the Ni etchant or Au etchant.

EXAMPLE 2

Figure 8A:
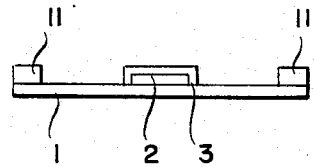
Figure 8A:
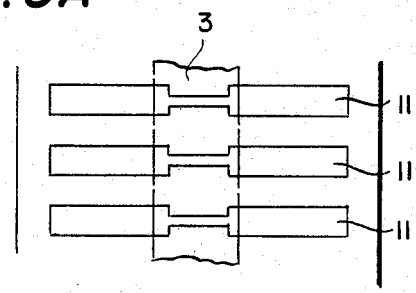

FIGS. 8(A), 8(A)' through 8(D), 8(D)' depict the manufacture of the TFT device according to another preferred embodiment of the present invention. A gate electrode 2 is disposed on a glass substrate 1 and made of Al, Ta, Nb or the like as a proper electrode material. This formation may be achieved by mask deposition, lift-off method, wet-etching or dry-etching. The gate electrode 2 is dipped into an ammonium borate solution, for example, to thereby develop a gate insulating coating 3 through anodic oxidation. As an alternative, this insulating coating may be deposited through the evaporation of $SiO_2$, $Al_2O_3$, $Y_2O_3$ and so forth.

Figure 8B:
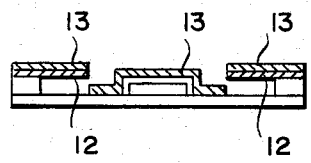
Figure 8B:
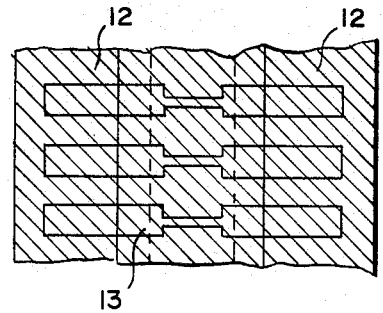

A semiconductor layer and a source/drain electrode may be patterned at the same time through the lift-off technique in the following manner. A photo-resist coating (e.g., AZ 1350 by Shipley Co.) is disposed to overly the substrate and then subjected to pre-baking, light exposure, development, rinsing and post-baking in the named order. As indicated in FIGS. 8(A) and 8(A)', the semiconductor layer and the source/drain electrode are patterned as denoted by 11. A mask 12 of FIG. 8(B) and 8(B)' is disposed for vacuum deposition of a semiconductor material such as Te and formation of a vacuum-deposited semiconductor layer 13.

Figure 8C:
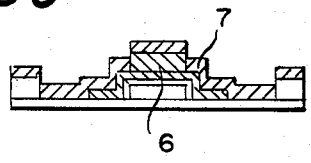
Figure 8C:
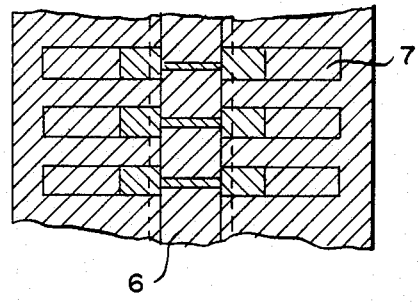
Figure 8D:
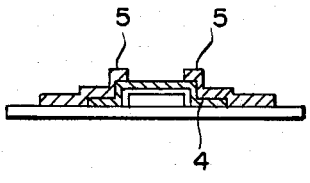
Figure 8D:
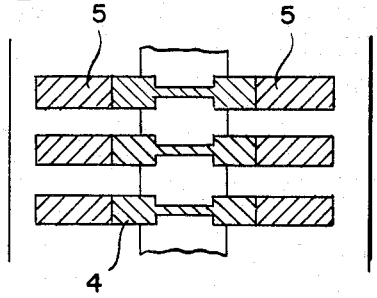

A mask 6 of FIGS. 8(C) and 8(C)' is used for vacuum deposition of a proper material for the source/drain electrode, for example, Ni and Au and growth of a vacuum-deposited source/drain layer 7. Ultrasonic cleaning with acetone is conducted to complete the manufacture of a TFT device including the semiconductor layer 4 and the source/drain electrode 5 as shown in FIGS. 8(D) and 8(D)'.

The resultant TFT device does not have the disadvantage that the semiconductor layer will disappear and cancel TFT characteristics as experienced in the step of patterning for the manufacture of the staggered type TFT device because an etchant is not used in patterning the semiconductor layer and the source/drain electrode. Furthermore, because of simultaneous formation of the patterned semiconductor layer and the patterned source/drain electrode through using mask deposition and lift-off technology, there is no possibility that the semiconductor layer Te will dissolve into the developer during patterning of the photo-resist coating for the source/drain electrode of the staggered type TFT device through the use of the lift-off technique. Thus, simplicity of patterning the electrode is insured.

EXAMPLE 3

Figure 9A:
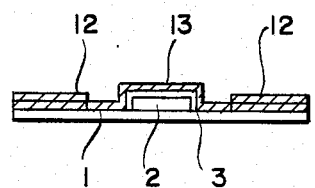
Figure 9A:
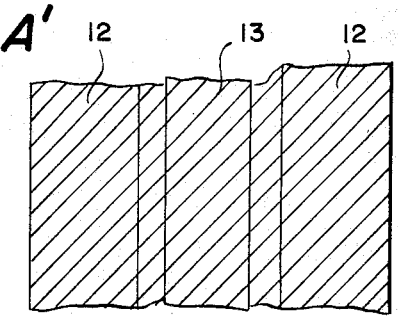
Figure 9B:
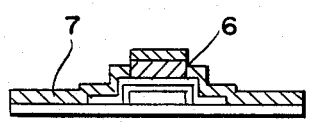
Figure 9B:
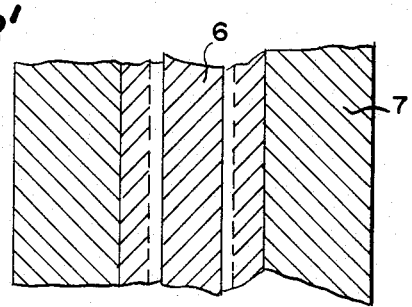
Figure 9C:
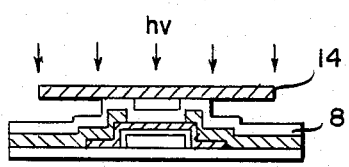
Figure 9C:
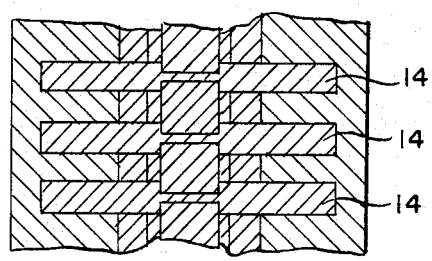

FIGS. 9(A), 9(B) through 9(E), 9(E)' are views for explaining the steps of making a TFT device according to still another embodiment of the present invention. A gate electrode 2 is disposed on a glass substrate 1 and made of Al, Ta, Nb or the like as a proper electrode material. This formation may be achieved by mask deposition, lift-off method, wet-etching or dry-etching. The gate electrode 2 is dipped into a 3% ammonium borate solution, for example, to thereby develop a gate insulating coating 3 through anodic oxidation. This insulating coating may also be deposited through the evaporating of $SiO_2$, $Al_2O_3$, $Y_2O_3$ and so forth. Then, a semiconductor layer and a source/drain electrode may be patterned through simultaneous etching in the following manner. A mask 12 of Fe—Ni—Co alloy, tungsten or stainless steel wire or strip as shown in FIG. 9(A) and 9(A)' is disposed to overly a portion of the glass substrate 1 for vacuum deposition of a semiconductor material such as Te and formation of a vacuum-deposited semiconductor layer 13. Subsequently, a mask 6, typically made of a Fe—Ni—Co alloy, tungsten or stainless steel wire or strip as shown in FIGS. 9(A) and 9(B)', is used for vacuum deposition of a proper material for the source/drain electrode, for example, Ni and Au and growth of a vacuum-deposited source/drain layer 7.

Figure 9D:
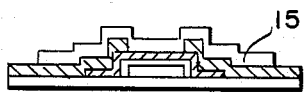
Figure 9D:
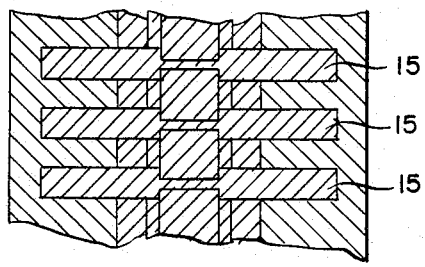
Figure 9E:
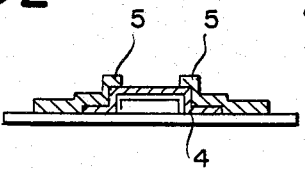
Figure 9E:
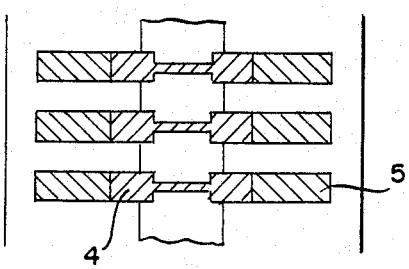

Disposed on the thus deposited layer is a photo-resist coating 8 (e.g., AZ 1350 by Shipley Co.) and which is shaped into the resist pattern 15 of FIGS. 9(D) and 9(D)' by a well known method with the use of a photo-mask 14.

The semiconductor layer Te is etched in an $I_2$—$NH_4$—$H_2O$—$C_2H_5OH$ solution at room temperature for 3 to 5 seconds. An $HNO_3$—$H_2O$ solution is used in the case when the metallic coating is Ni. After etching the photo-resist coating is removed with acetone, thus completing the manufacture of TFT patterns 4 and 5.

Since in the above illustrated embodiment the semiconductor layer Te is covered with the resist coating as seen from FIGS. 9(D) and 9(D)', a TFT device can be made without the influence of the Ni etchant or Au etchant. Moreover, the above mentioned combined use of mask deposition and chemical etching provides simplicity of alignment between the deposition mask and the substrate and significant advantages for mass production of fine-pattern TFT devices.

EXAMPLE 4

FIGS. 10(A), 10(A)' through 10(G), 10(G)' are views for explaining the steps of making a TFT device according to another embodiment of the present invention. A gate electrode 2 is disposed on a glass substrate 1 and made of Al, Ta, Nb or the like as a proper electrode material. This formation may be achieved by mask deposition, lift-off method, wet-etching or dry-etching. The gate electrode 2 is dipped into an ammonium borate solution, for example, to thereby develop a gate insulating coating 3 through anodic oxidation. As an alternative, this insulating coating may be deposited through the evaporation of $SiO_2$, $Al_2O_3$, $Y_2O_3$ and so forth. Then, a semiconductor layer and a source/drain electrode of the coplanar type TFT device are patterned as follows. A mask 6 of Fe—Ni—Co alloy, tungsten or stainless steel wire or strip with a thickness as shown in FIG. 10(A) and 10(A)' is disposed to overly the glass substrate 1 and the gate insulating coating 3 for vacuum deposition of a source/drain electrode material such as Au and Ni and formation of a vacuum-deposited source/drain electrode layer 7. Subsequently, disposed on the thus deposited layer 7 is a photo-resist coating 8 (e.g., AZ 1350 by Shipley Co.) with a thickness of 0.3–0.6 μm as shown in FIGS. 10(C) and 10(C)'. By a well known method with the use of a photo-mask 9 light exposure is effected to obtain the same pattern as the photo-mask after development. After post-baking, the resultant device is etched within an $HNO_3$—$H_2O$ solution and the photo-resist is removed with acetone to form the source/drain electrode pattern 5 of FIGS. 10(D) and 10(D)' in the case that the metallic coating is Ni. An $I_2$—$NH_4$—$H_2O$—$C_2H_5OH$ solution is used for etching at room temperature for 60 to 90 seconds in the case of Au. After etching, the photo-resist coating is removed with acetone thus forming the source/drain electrode pattern 5. Subsequently disposed on the substrate is a photo-resist coating (e.g., AZ 1350 by Shipley Co.) with a thickness of 0.3 to 0.6 μm as shown in FIGS. 10(E) and 10(E)'. After pre-baking light exposure and development follow with the aid of a photo-mask 16, forming a pattern 20 as shown in FIGS. 10(F) and 10(F)'. After post-baking a semiconductor layer of Te is vacuum-deposited on the patterned photo-resist coating to form a vacuum-deposited semiconductor layer 13. Ultrasonic cleaning with acetone is effected to complete the manufacture of a desired semiconductor layer 4 as shown in FIGS. 10(G) and 10(G)'.

The above illustrated embodiment relying upon the combined use of mask deposition and etching offers the following advantages. In other words, as long as the source/drain electrode is formed merely through chemical-etching or lift-off technique, there is no possibility that the edge portion of the source/drain electrode will bear a sharp undercut and exhibit poor connection with the semiconductor layer and sometimes break. This result is an improvement of yield and fineness of the patterns.

EXAMPLE 5

Figure 11A:
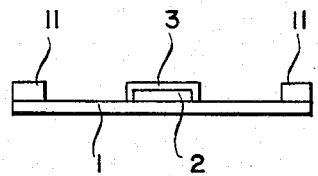
Figure 11A:
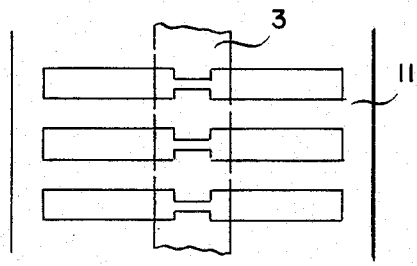
Figure 11B:
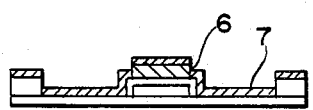
Figure 11B:
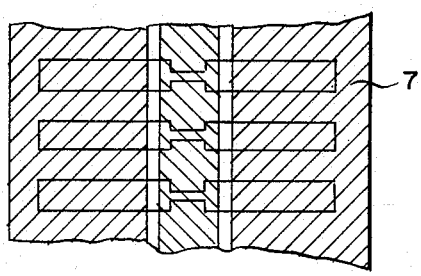
Figure 11C:
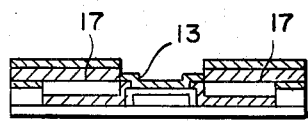
Figure 11C:
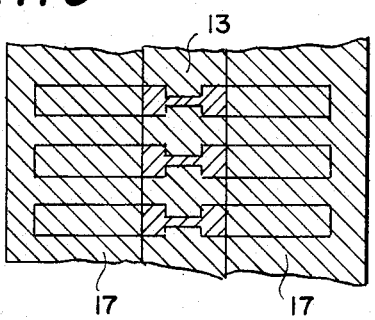
Figure 11D:
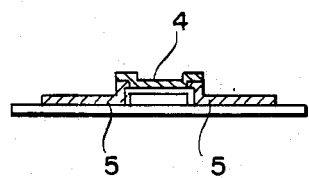
Figure 11D:
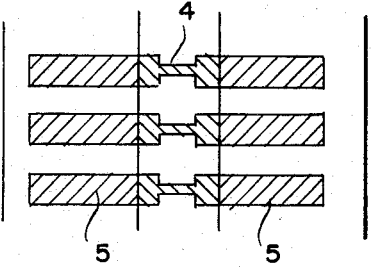

FIGS. 11(A), 11(A)' through 11(D), 11(D)' show steps of making a TFT device according to still another embodiment of the present invention. A gate electrode 2 is disposed on a glass substrate 1 and made of Al, Ta, Nb or the like as a proper electrode material. This formation may be achieved by mask deposition, lift-off method, wet-etching or dry-etching. The gate electrode 2 is dipped into an ammonium borate solution, for example, to thereby form a gate insulating coating 3 through anodic oxidation. Another way to form patterns on the coplanar type TFT device according to the present invention will now be described. As seen from FIGS. 11(A) and 11(A)', a photo-resist coating (e.g., AZ 1350 by Shipley Co.) is disposed in a well known manner. Subsequently, a mask 6 typically made of a Fe—Ni—Co alloy, a tungsten or stainless steel wire or strip as shown in FIGS. 11(B) and 11(B)' is used for vacuum deposition of a proper material for the source/drain electrode, for example, Ni and Au and thus growth of a vacuum-deposited source/drain layer 7. A different mask 17 of Fe—Ni—Co alloy, tungsten or stainless steel wire or strip as shown in FIGS. 7(C) and 7(C)' is disposed for vacuum deposition of a semiconductor material such as Te and formation of a vacuum-deposited semiconductor layer 13. Subsequently, the resultant device is subjected to ultrasonic cleaning within acetone twice for the formation of desired patterns of the source/drain electrode 5 and the semiconductor layer 4 in the coplanar type TFT device.

Since the source/drain electrode of the resultant TFT device is not formed only by chemical-etching or lift-off techniques, the source/drain electrode does not have the problem that its edge bears a sharp undercut and exhibits poor contact with the semiconductor layer and resulting in breaks therein. Furthermore, since the semiconductor layer and the source/drain electrode are formed simultaneously through the combined use of a mask deposition and a lift-off technique, the previously formed gate electrode is protected against damage and simplicity in increasing patterning accuracy and alignment of the deposition mask with respect to the substrate in favor of mass productivity is realized.

EXAMPLE 6

Figure 12A:
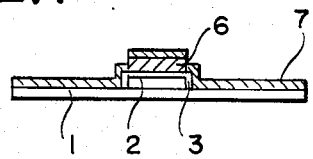
Figure 12A:
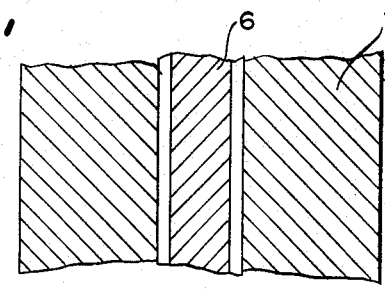
Figure 12B:
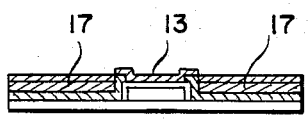
Figure 12B:
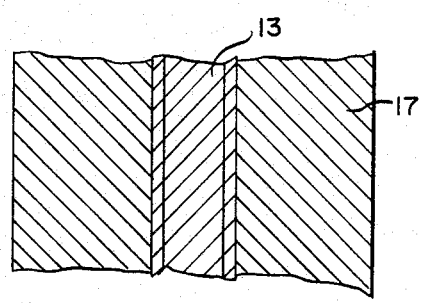

FIGS. 12(A), 12(A)' through 12(E), 12(E)' further illustrate steps of manufacturing a TFT device according to yet another embodiment of the present invention.

A gate electrode 2 is disposed on a glass substrate 1 and made of Al, Ta, Nb or the like as a proper electrode material. This formation may be achieved by mask deposition, lift-off method, wet-etching or dry-etching. The gate electrode 2 is dipped into an ammonium borate solution, for example, to thereby develop a gate insulating coating 3 through anodic oxidation. As an alternative, this insulating coating may be formed through evaporation of $SiO_2$, $Al_2O_3$, $Y_2O_3$ and so forth.

Figure 12C:
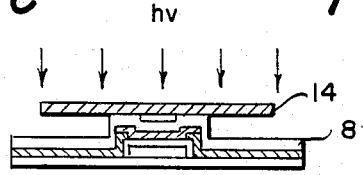
Figure 12C:
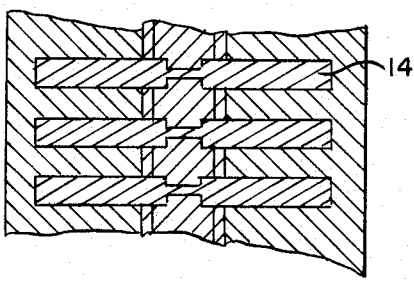
Figure 12D:
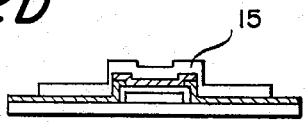
Figure 12D:
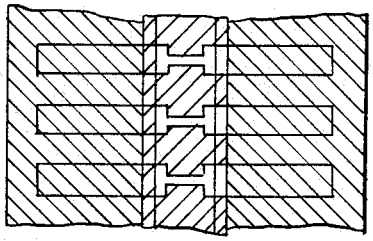
Figure 12E:
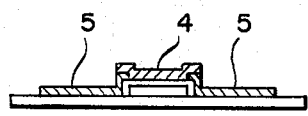
Figure 12E:
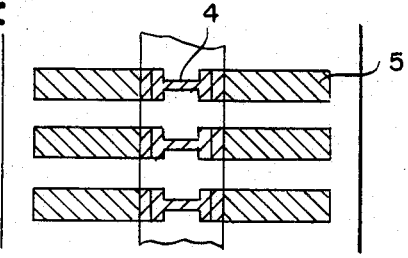

Then, patterns on the coplanar type TFT device are formed in a different manner according to the present invention. A mask 6 typically made of a Fe—Ni—Co alloy, tungsten or stainless steel wire or strip as shown in FIGS. 12(A) and 12(A)' is used for vacuum deposition of a proper material for the source/drain electrode, for example, Ni and thus growth of a vacuum-deposited source/drain layer 7. A different mask of Fe—Ni—Co alloy, tungsten or stainless steel wire or strip is disposed for vacuum deposition of a semiconductor material such as Te and formation of a vacuum-deposited semiconductor layer 13. Subsequently, a photo-resist coating 8 (e.g., AZ 1350 by Shipley Co.) is deposited as shown in FIGS. 12(C) and 12(C)'. After pre-baking, light exposure, development and post-baking are effected to obtain a photo-resist pattern 15 as shown in FIG. 12(D) and 12(D)' by a well known method with the use of a photo-mask 14. The resultant semiconductor layer Te is etched in a $I_2$—$NH_4$—$H_2O$—$C_2H_5OH$ solution at room temperature for 3 to 5 seconds, whereas the source/drain electrode Ni is etched in an $HNO_3$—$H_2O$ solution. The photo-resist coating is removed with acetone to form the source/drain electrode pattern 5 and the semiconductor layer pattern 4 as shown in FIGS. 12(E) and 12(E)'.

Figure 6:
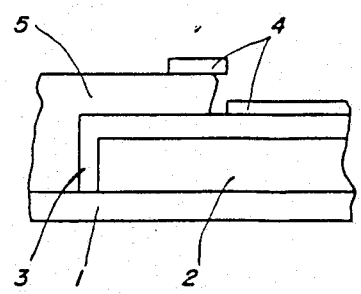
FIG. 6 is a partially enlarged view of a source/drain electrode in the conventional TFT devices.

Since the source/drain electrode of the resultant TFT device is not formed by only chemical-etching or lift-off, the source/drain electrode will not experience problems that its edges bears a sharp undercut as depicted in FIG. 6 or exhibit poor contact with the semiconductor layer causing breaks therein. Furthermore, since the semiconductor layer Te is covered with the resist coating as seen from FIGS. 12(D) and 12(D)', the TFT device can be made without being influenced by the Ni etchant. Further, the remarkable advantages of this embodiment are exhibited in the fineness of the resultant patterns and high mass productivity.

EXAMPLE 7

Figure 13A:
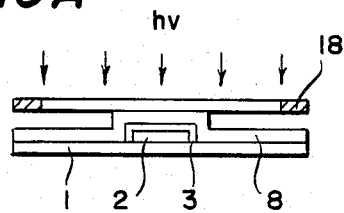
Figure 13A:
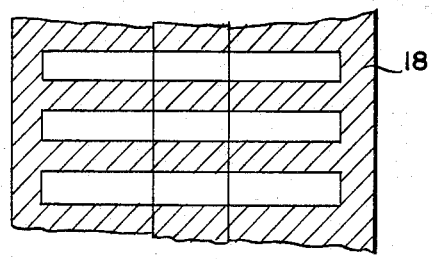

FIGS. 13(A), 13(A)' through 13(H), 13(H)' show steps of making a TFT device according to another embodiment of the present invention. A gate electrode 2 is disposed on a glass substrate 1 and made of Al, Ta, Nb or the like as a proper electrode material. This formation may be achieved by mask deposition, lift-off method, wet-etching or dry-etching. The gate electrode 2 is dipped into an ammonium borate solution, for example, to thereby develop a gate insulating coating 3 through anodic oxidation. As an alternative, this insulating coating may be developed through the evaporation of $SiO_2$, $Al_2O_3$, $Y_2O_3$ and so forth.

Figure 13B:
Figure 13B:
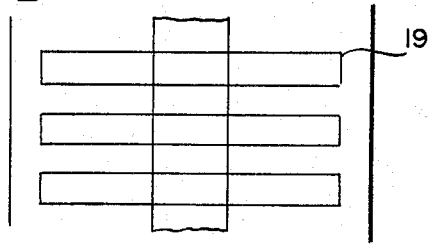
Figure 13C:
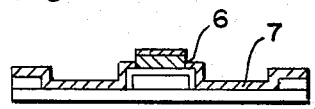
Figure 13C:
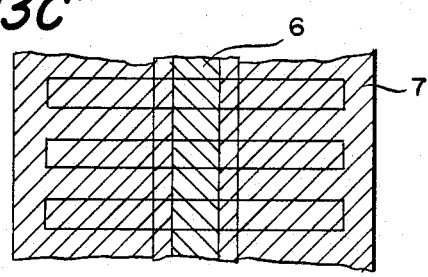
Figure 13D:
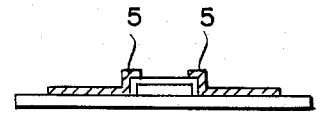
Figure 13D:
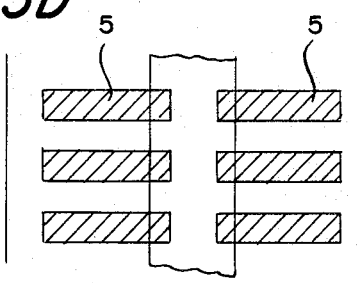
Figure 13E:
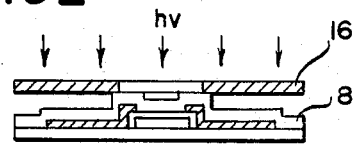
Figure 13E:
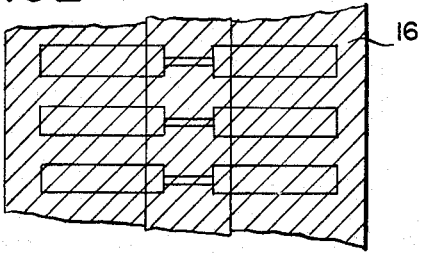
Figure 13F:
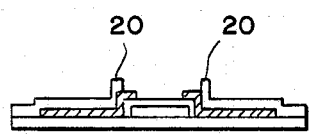
Figure 13F:
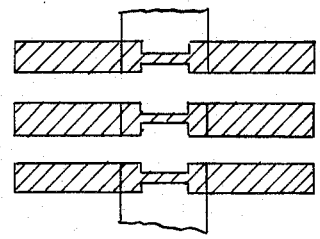
Figure 13G:
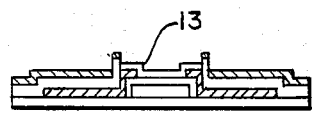
Figure 13G:
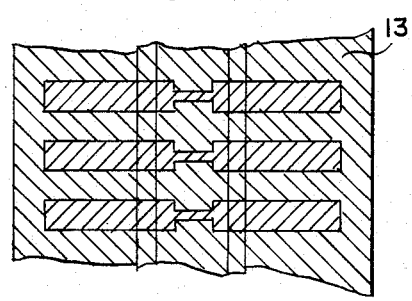
Figure 13H:
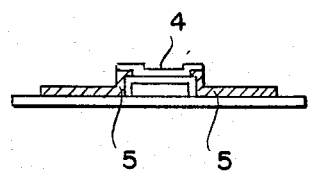
Figure 13H:
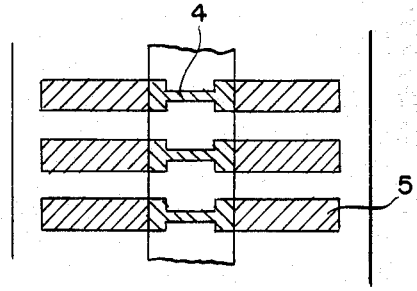

Another way to form patterns on the coplanar type TFT device according to the present invention will be discussed below. After a photo-resist coating 8 (typically, AZ 1350 by Shipley Co.) is disposed and pre-baked as depicted in FIGS. 13(A) and 13(A)', light exposure via a pattern 18, development and post-baking are effected in the named order to form a resist pattern 19 as shown in FIGS. 13(B) and 13(B)'. Then, a masking 6 is effected typically using a Fe—Ni—Co alloy, tungsten or stainless steel wire or strip 6 as shown in FIGS. 13(C) and 13(C)' for vacuum deposition of a proper material for the source/drain electrode, for example, Ni and thus growth of a vacuum-deposited source/drain layer 7. The substrate is subjected to ultrasonic cleaning with acetone to develop a source/drain electrode pattern 5 as depicted in FIGS. 13(D) and 13(D)'. Similarly, after a photo-resist coating 8 (typically, AZ 1350 by Shipley Co.) is disposed and pre-baked as depicted in FIGS. 13(E) and 13(E)', light exposure, development and post-baking are effected in the named order with the aid of a photo-mask 16 to form a resist pattern 20 as shown in FIGS. 13(F) and 13(F)'. Then, vacuum deposition of a proper material for the semiconductor layer such as Te is carried out to thereby form a vacuum-deposited semiconductor layer 13. The device is subject to ultrasonic cleaning within acetone to develop a source/drain electrode pattern 5 and a semiconductor layer pattern 4 as depicted in FIGS. 13(H) and 13(H)'.

Since the source/drain electrode of the resultant TFT device is patterned with masking as depicted in FIGS. 13(C) and 13(C)', the source/drain electrode will not be sharply undercut as depicted in FIG. 6. There is therefore no problem with the electrode exhibiting poor contact with the semiconductor layer Te and causing breaks therein.

Figure 1A:
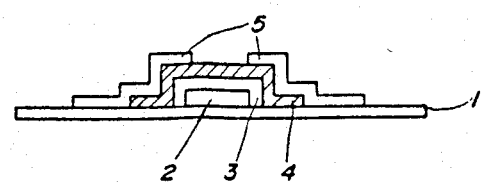
FIGS. 1A to 3B are schematic views of conventional TFT devices.
Figure 1B:
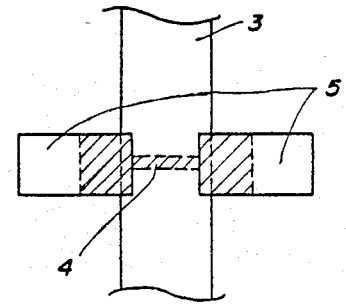
Figure 2A:
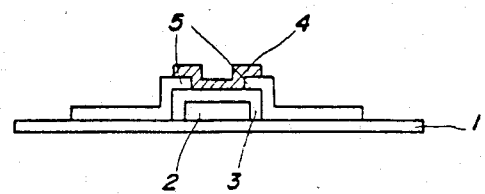
Figure 2B:
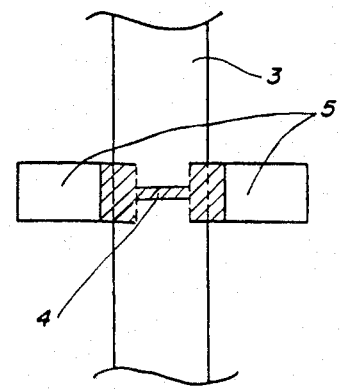
Figure 3A:
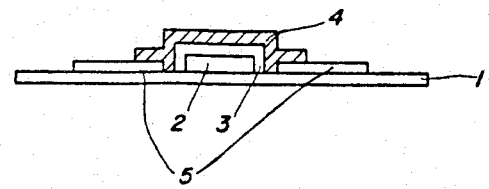
Figure 3B:
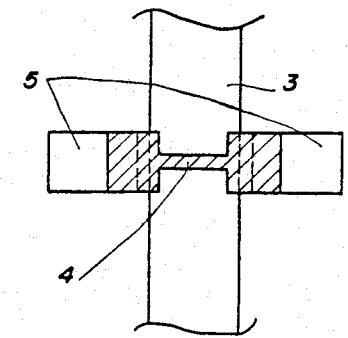
Figure 4:
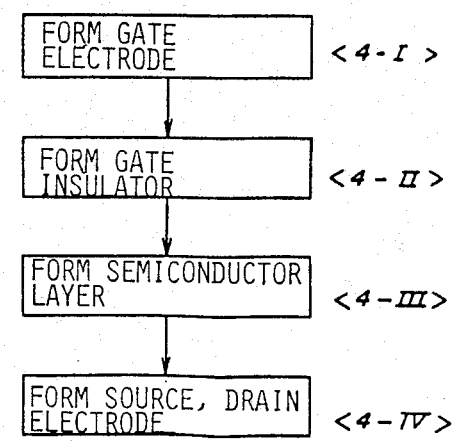
FIGS. 4 and 5 are flow charts for explanation of the manufacture of the conventional TFT devices.
Figure 5:
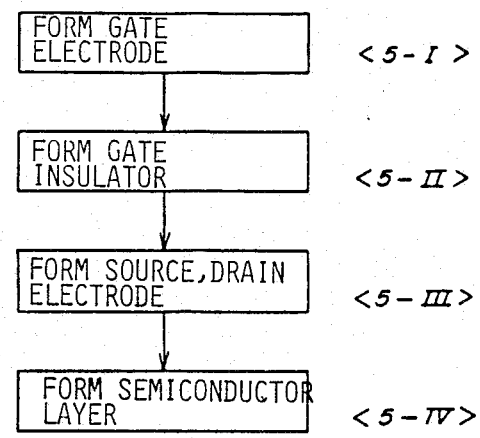

It is obvious to those skilled in the art that the foregoing techniques are also applicable to the coplanar type TFT device as shown in FIG. 3 and in FIG. 2. Furthermore, the present invention provides a high density array of TFT devices with effectiveness in manufacturing the TFT devices as shown in FIGS. 1, 2 and 3.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A method of making a thin film transistor device comprising an insulator substrate, a gate electrode, a semiconductor layer and a source/drain electrode disposed on said insulator substrate, which comprises:

providing a insulator substrate with a gate electrode formed thereon said gate electrode having a gate insulating oxide coating;

forming selectively a semiconductor layer thereon;

superimposing a mask over selected portions of said gate insulating coating and said semiconductor layer and depositing a source/drain electrode material thereon;

removing said mask and depositing a uniform coating of a photo-resist material on said source/drain electrode material which remains on said substrate;

selectively exposing said photo-resist material to light and developing said exposed material to form a resist pattern;

etching said resulting patterned configuration to form a desired source/drain electrode pattern thereon to provide said thin film transistor.

2. The method of claim 1, wherein said semiconductor layer comprises a Te electrode and said source/drain material is selected from Aµ and Ni.

3. The method of claim 1, wherein said photo-resist material is deposited to a thickness of 0.3–0.6 µm.

4. The method of claim 1, wherein said gate insulating oxide coating is formed by anodic oxidation.

5. The method of claim 1, wherein said gate insulating oxide coating is formed by evaporation.

6. A method of fabricating a coplanar thin film transistor device comprising an insulator substrate, a gate electrode, a semiconductor layer and a source/drain electrode disposed on said insulator substrate, which comprises:

providing a insulator substrate with a gate electrode formed thereon said gate electrode having a gate insulating oxide coating;

a mask is superimposed over said insulating substrate and said gate insulating coating and a source/drain electrode material is deposited thereon;

removing said mask and depositing a uniform coating of a first photo-resist material on said source/drain electrode material which remains;

selectively exposing said photo-resist material to light and developing said exposed material to form a first resist pattern;

etching said resulting patterned configuration to form a source/drain electrode pattern;

applying a second photo-resist coating uniformly to said patterned configuration, selectively exposing said second photo-resist coating to light and developing said exposed coating to form a second resist pattern, and depositing a semiconductor material on said patterned photo-resist coating to form a semiconductor layer and removing said remaining photo-resist pattern material to produce a patterned semiconductor layer thereon and provide said thin film transistor device.

7. The method of claim 6, wherein said semiconductor material comprises Te and said source/drain material is selected from Aµ and Ni.

8. The method of claim 6, wherein said first and second photo-resist coatings are deposited at a thickness of 0.3–0.6 µm.

9. The method of claim 6, wherein said insulating oxide coating is formed by anodic oxidation.

10. The method of claim 6, wherein said insulating oxide coating is formed by evaporation.

11. A method of fabricating a thin film transistor device comprising an insulator substrate, a gate electrode, a semiconductor layer and a source/drain electrode disposed on said insulator substrate, which comprises:

providing a insulator substrate with a gate electrode formed thereon said gate electrode having a gate insulating oxide coating;

uniformly coating a photo-resist over said insulator substrate and selectively exposing said photo-resist to form a resist pattern thereon;

providing a mask over a selected portion of said gate insulating coating and depositing a source/drain electrode material thereon;

removing said mask and resist pattern to form a source/drain electrode pattern;

applying a second photo-resist coating uniformly to said source/drain electrode pattern, selectively exposing said second photo-resist coating to light and developing said exposed coating to form a second resist pattern; and depositing a semiconductor material on said patterned photo-resist coating and removing said remaining photo-resist pattern material to produce a patterned semi-conductor layer thereon to provide said thin film transistor device.

12. The method of claim 11, wherein said semiconductor layer comprises Te and said source/drain electrode material is Ni.

13. The method of claim 11, wherein said gate insulating oxide coating is formed by anodic oxidation.

14. The method of claim 11, wherein said gate insulating oxide coating is formed by evaporation.

* * * * *